(12) United States Patent
Nurminen

(10) Patent No.: US 8,510,105 B2
(45) Date of Patent: Aug. 13, 2013

(54) COMPRESSION AND DECOMPRESSION OF DATA VECTORS

(75) Inventor: Jani K. Nurminen, Lempäälä (FI)

(73) Assignee: Nokia Corporation, Espoo (FI)

( * ) Notice: Subject to any disclaimer, the term of this patent is extended or adjusted under 35 U.S.C. 154(b) by 2195 days.

(21) Appl. No.: 11/256,667

(22) Filed: Oct. 21, 2005

(65) Prior Publication Data

US 2007/0094019 A1    Apr. 26, 2007

(51) Int. Cl.
*G10L 19/00* (2006.01)
*G10L 19/12* (2006.01)

(52) U.S. Cl.
USPC ......... 704/222; 704/230; 704/256.8; 704/236

(58) Field of Classification Search
USPC ............... 704/230, 256.8, E19.015, E15.035, 704/222, 236, 247
See application file for complete search history.

(56) References Cited

U.S. PATENT DOCUMENTS

| | | | |
|---|---|---|---|
| 6,298,169 B1 * | 10/2001 | Guenter ..................... | 382/253 |
| 6,754,624 B2 * | 6/2004 | Choy et al. .................. | 704/233 |
| 7,003,454 B2 * | 2/2006 | Ramo .......................... | 704/223 |
| 7,249,014 B2 * | 7/2007 | Kannan et al. .............. | 704/219 |
| 7,310,598 B1 * | 12/2007 | Mikhael et al. .............. | 704/230 |
| 2001/0010038 A1 * | 7/2001 | Kang et al. .................... | 704/222 |
| 2004/0153318 A1 * | 8/2004 | Chamberlain ................ | 704/222 |

OTHER PUBLICATIONS

Fioravanti et al. "A prediction strategy for efficient entropy coding of VQ addresses" on Information Theory, 1994. Proceedings., 1994 IEEE International Symposium on, p. 240.*

Tsi et al. "A new dynamic finite-state vector quantization algorithm for image compression" Image Processing, IEEE Transactions on vol. 9, Issue 11, Nov. 2000 pp. 1825-1836.*

Linden, "Channel optimized predictive vector quantization", Jul. 2000, Speech and Audio Processing, IEEE Transactions , vol. 8, pp. 370-384.*

Paliwal, et al. "Effect of Ordering the Codebook on the Efficiency of the Partial Distance Search Algorithm for Vector Quantization" IEEE Transactions on Communications 37(5): 538-540 (1989).*

LeBlanc "Efficient search and design procedures for robust multistage VQ of LPC parameters for 4 kb/s speech coding", IEEE Signal Processing Society, 1993, vol. 1, issue 4, pp. 373-385.*

"A Framework for Low Bit-Rate Speech Coding in Noisy Environment" by Venkatesh Krishnan; School of Electrical and Computer Engineering, Georgia Institute of Technology, Mar. 2005, XP-002430979, pp. 1-134.

(Continued)

*Primary Examiner* — Pierre-Louis Desir
*Assistant Examiner* — Abdelali Serrou
(74) *Attorney, Agent, or Firm* — Alston & Bird LLP

(57) ABSTRACT

For an enhanced sequential compression of data vectors in a respective compression pass, a current data vector is mapped to at least one current code vector of at least one codebook in at least one quantization stage. The at least one codebook is reordered taking account of at least one intermediate result from the current compression pass and at least one intermediate result from a preceding compression pass. At least one codebook index that is associated in the at least one reordered codebook to the at least one current code vector is then provided for further use. For a decompression of compressed data vectors represented by such codebook indices, at least one codebook index is mapped to at least one code vector of at least one equally reordered codebook.

26 Claims, 4 Drawing Sheets

(56) References Cited

OTHER PUBLICATIONS

"Vector Quantizers for Reduced Bit-Rate Coding of Correlated Sources" by Russell M. Mersereau; Banff International Research Station for Mathematical Innovation and Discovery Workshop 05W5505, [Online] Jul. 23-28, 2005, XP-002430980, pp. 1-33.

"DCRVQ: A New Strategy for Efficient Entropy Coding of Vector-Quantized Images" by F. DeNatale, et al, IEEE Transactions on Communications, vol. 44, No. 6, Jun. 1996, pp. 696-706.

"Using Dynamic Codebook Re-Ordering to Exploit Inter-frame Correlation in MELP Coders" by V. Krishnan et al, Proceedings of Eurospeech/Interspeech 2005, pp. 2717-2720.

"Pitch-Cycle Waveform Quantization in a 4.0 KBPS WISpeech Coder" by J. Nurminen, Master of Science Thesis, Tampere University of Technology, Dept. of Information Technology, 2001.

"Two Novel Lossless Algorithms to Exploit Index Redundancy in VQ Speech Compression" by S. Sridharan et al, Proceedings of ICASSP '98, pp. 57-60.

"An Efficient Codebook Post-Processing Technique and a Window-Based Fast-Search Algorithm for Image Vector Quantization" by G. Shen et al, IEEE Transactions on Circuits and Systems for Video Technology, vol. 10, No. 6, Sep. 2000, pp. 990-997.

"Evaluation of Split and Multistage Techniques in LSF Quantization" by U. Sinervo et al, Proceedings of Norsig 2001, pp. 18-22.

* cited by examiner

COMPRESSION AND DECOMPRESSION OF DATA VECTORS

FIELD OF THE INVENTION

The invention relates to a method, an encoder, an electronic device and a software program product for compressing data vectors. The invention relates equally to method, a decoder, an electronic device and a software program product for decompressing compressed data vectors. The invention relates further to a system comprising such an encoder and such a decoder.

BACKGROUND OF THE INVENTION

When data is to be stored or transmitted, it is usually converted to this end into an alternative, compressed representation.

One of the most powerful tools in the field of data compression is vector quantization, which is applied to data in vector format. Basic vector quantization makes use of a codebook, which associates a number of code vectors to a respective codebook index. For each input data vector, one of the code vectors is determined to be the best representation of the input data vector. The determined code vector constitutes thus a quantized data vector. The codebook index that is associated to this code vector is selected as a compressed representation of the input data vector. In decoding, a decompressed quantized data vector can then be regained by replicating the code vector corresponding to the code index.

Alternatively to the basic vector quantization, also an advanced vector quantization, like multistage vector quantization or predictive vector quantization, can be used for the data compression, in order to enhance the accuracy of the quantization.

In multistage vector quantization, the input data vector is quantized in two or more additive stages. The objective is to find a code vector combination, in other words a sum of code vectors selected at different stages, that minimizes the distortion which results in the quantization. Each of the selected code vectors is then mapped to a codebook index in a respective codebook. The code vector selections are performed based on a search algorithm. The simplest approach is to use a sequential search. In this case, a first code vector is determined at a first stage. The difference between the input data vector and the first code vector is used as input vector for a second stage, etc. A more sophisticated approach is, for example, the use of a tree search algorithm that performs the code vector selections at different stages in a joint manner. In an M-L search tree vector quantization, for instance, the M best first code vectors are determined at the first stage. Proceeding from these M best first code vectors, the M best second code vectors are determined at the second stage, etc. Finally, the best combination of the M best first to L code vectors is selected. The sequential search approach and the M-L search tree approach was described for instance by J. Nurminen in: "Pitch-cycle waveform quantization in a 4.0 kbps WI speech coder", Master of Science thesis, Tampere University of Technology, Department of Information Technology, 2001.

In predictive vector quantization, a prediction of the input data vector is calculated using information about a finite number of previously quantized vectors. Then, the prediction error vector, which is also referred to as prediction residual, is quantized instead of the original input vector by selecting a code vector. Again, the selected code vector is compressed by mapping it to a codebook index. In decoding, the output is computed by adding a calculated prediction and the regained quantized prediction error vector. The predictive vector quantization was equally described for instance in the above cited document "Pitch-cycle waveform quantization in a 4.0 kbps WI speech coder".

The codebook indices that are determined in the vector quantization can be stored and/or transmitted as such. Alternatively, the coding can be further enhanced by applying some lossless compression technique, like the well-known Huffman coding approach, to compress the codebook indices. However, simply applying a lossless compression technique does usually not result in considerable improvements. Such techniques are efficient, in case the probabilities with which different codebook indices are selected are quite different from each other. Often, though, the probabilities for the selection of different codebook indices are quite similar, making lossless coding relatively inefficient.

The basic dynamic codebook reordering technique was designed to enhance the situation by making the probability distribution more favourable from the viewpoint of lossless compression. The main idea of dynamic codebook reordering is to reorder the codebook in such a way that the selected code vector becomes the first code vector and that the remaining code vectors are arranged according to their distance to this first vector. Since the data that is to be compressed is usually not completely uncorrelated, this makes the probability distribution non-flat, which in turn reduces the entropy and makes the codebook indices easier to compress. Dynamic codebook reordering was presented for instance by S. Sridharan and J. Leis in: "Two novel lossless algorithms to exploit index redundancy in VQ speech compression", proceedings of ICASSP '98, pp. 57-60.

The dynamic codebook reordering approach is usually very efficient in simple one-stage quantization. When applied to advanced quantizer structures, such as multi-stage quantizers or predictive quantizers, it still brings some improvement, but the improvements are usually rather small.

When a dynamic codebook reordering is used in multistage vector quantization, the dynamic reordering technique is applied to each stage of the quantizer in isolation by evaluating the distance of the code vectors in the respective codebook to the selected code vector as the sorting criterion. This evaluation is carried out separately for each stage after storing or transmitting the codebook index at the encoder and after accessing the codebook at the decoder, to keep the synchrony between encoding and decoding. Mathematically, the sorting in stage j is done in the order of increasing distance $D_j$ that can be computed as:

$$D_j = d(c_j, y_j), \quad (1)$$

where $c_j$ is the respective code vector of the codebook from stage j for which the distance is to be computed, where $y_j$ is the code vector that was just selected or retrieved from this codebook, and where $d(\cdot)$ is the distortion measure that is to be used. Practically any distortion measure can be applied, one example being the Euclidean distance.

The use of a dynamic codebook reordering in multistage vector quantization was described for instance by V. Krishnan, T. P. Barnwell III and D. V. Anderson in: "Using dynamic codebook re-ordering to exploit inter-frame correlation in MELP coders", proceedings of Eurospeech/Interspeech '05, pp. 2717-2720. It was also stated in this paper that after the first stage, the code vectors are more decorrelated, which makes the reordering technique less efficient. The authors actually decided not to use the advanced multi-stage structure at all because of this reason and chose to use a simple split vector quantizer instead, despite the fact that multi-stage vector quantization clearly outperforms split vector quantization.

When a dynamic codebook reordering is used in predictive vector quantization, the dynamic codebook reordering may be realized simply by using the distance of all codebook entries to the selected codebook entry as the sorting criterion. The distance D can be computed for instance as $$D=d(c,y), \qquad (2)$$

where c is the respective code vector from the codebook for which the distance is to be computed, where y is the code vector that was just selected or retrieved from the codebook, and where $d(\cdot)$ is again the distortion measure. The prediction is not taken into account, except for the fact that the vectors to be quantized are prediction residuals.

Another approach for combined use of prediction and dynamic codebook reordering has been presented by F. G. B. DeNatale, S. Fioravanti and D. D. Giusto in: "DCRVQ: A new strategy for efficient entropy coding of vector-quantized images", IEEE Transactions on Communications, vol. 44, no. 6, pp. 696-706. In this approach, the sorting criterion was:

$$D=d(c,p), \qquad (3)$$

where p is the predicted vector, where c is again the particular code vector from the codebook for which the distance is computed, and where $d(\cdot)$ is the Euclidean distance. The actual quantization is performed straightforwardly on the input data vectors without using the prediction. With this approach, it is possible to exploit prediction, but only in a limited manner, since the code vectors are located in the original space and not in the "prediction residual" space. Thus, the prediction reduces the bitrate, but the accuracy is not improved. Moreover, this approach can only be used if the structure contains only one quantization stage.

Thus, the conventional dynamic codebook reordering techniques result only in a relatively small improvement when applied to more advanced and efficient quantization approaches, such as multi-stage vector quantization or predictive quantization.

SUMMARY OF THE INVENTION

It is an object of the invention to improve the efficiency of data compression. In particular, it is an object of the invention to improve the efficiency of vector quantization using dynamic codebook reordering.

For an encoding side, a method for compressing data vectors sequentially in a respective compression pass is proposed. The method comprises mapping a current data vector to at least one current code vector of at least one codebook in at least one quantization stage. The method further comprises reordering the at least one codebook taking account of at least one intermediate result from the current compression pass and at least one intermediate result from a preceding compression pass. The method further comprises providing a respective codebook index that is associated in the at least one reordered codebook to the at least one current code vector.

For an encoding side, moreover an encoder for compressing data vectors sequentially in a respective compression pass is proposed. The encoder comprises a quantizing portion adapted to map a current data vector to at least one current code vector of at least one codebook in at least one quantization stage. The encoder further comprises a reordering portion adapted to reorder at least one codebook taking account of at least one intermediate result from a current compression pass and at least one intermediate result from a preceding compression pass. The encoder further comprises a selection portion adapted to provide at least one codebook index that is associated in at least one reordered codebook to at least one current code vector.

For an encoding side, moreover an electronic device is proposed. The electronic device comprises for a sequential compression of data vectors in a respective compression pass the same components as the proposed encoder.

For an encoding side, finally a software program product is proposed, in which a software code for compressing data vectors sequentially in a respective compression pass is stored. When being executed by a processing unit of an electronic device, the software code realizes the method proposed for the encoding side. The software program product may be for example a separate storage medium, a storage medium integrated in a device or a buffer of a processing portion, etc.

For a decoding side, a method for decompressing compressed data vectors sequentially in a respective decompression pass, wherein each compressed data vector is represented by at least one codebook index, is proposed. The method comprises reordering at least one codebook taking account of at least one intermediate result from the current decompression pass and at least one intermediate result from a preceding decompression pass. The method further comprises mapping at least one codebook index representing a compressed current data vector to at least one code vector of the at least one reordered codebook.

For a decoding side, moreover a decoder for decompressing compressed data vectors sequentially in a respective decompression pass, wherein each compressed data vector is represented by at least one codebook index, is proposed. The decoder comprises a reordering portion adapted to reorder at least one codebook taking account of at least one intermediate result from a current decompression pass and at least one intermediate result from a preceding decompression pass. The decoder further comprises a selection portion adapted to map at least one codebook index representing a compressed current data vector to at least one code vector of the at least one reordered codebook.

For a decoding side, moreover an electronic device is proposed. The electronic device comprises for a sequential decompression of compressed data vectors in a respective decompression pass, wherein each compressed data vector is represented by at least one codebook index, the same components as the proposed decoder.

For a decoding side, moreover a software program product is proposed, in which a software code for decompressing compressed data vectors sequentially in a respective decompression pass, wherein each compressed data vector is represented by at least one codebook index, is stored. When being executed by a processing unit of an electronic device, the software code realizes the method proposed for the decoding side. Again, the software program product may be for example a separate storage medium, a storage medium integrated in a device or a buffer of a processing portion, etc.

Finally, a system is proposed which comprises the proposed encoder and the proposed decoder. It is to be understood that the system could be realized in a single electronic device comprising both encoder and decoder, or in two electronic devices, one comprising the encoder and the other one the decoder.

The invention proceeds from the consideration that the performance of a data compression using a dynamic codebook reordering is influenced by the criterion used for the reordering. It is therefore proposed that this criterion is modified. In a conventional codebook reordering, simply the distance of the codebook code vectors to a selected code vector is computed. The conventional codebook reordering thus takes account only of an intermediate result of a single compression pass. The invention proposes that intermediate results of at least two compression passes are introduced into the reordering criterion in such a way that one of these passes is the current unfinished compression pass. In general, the modified criterion may take into account the whole quantizer structure and all the available information in a distance computation.

It has to be noted that in the case of several quantization stages, it is not required that intermediate results from current and proceeding compression passes are considered in the codebook reordering for each quantization stage.

It is an advantage of the invention that it enhances the dynamic codebook reordering technique and makes it applicable also to advanced quantizer structures. Thereby, it allows achieving a high coding accuracy and bitrate savings at the same time with very little or no additional complexity.

The at least one codebook index that is provided can be obtained in different ways.

In one exemplary embodiment of the invention, first the at least one codebook is reordered. Then, at least one codebook index is selected that is associated in the at least one reordered codebook to the at least one current code vector.

In another exemplary embodiment of the invention, first at least one preliminary codebook index is selected that is associated in the at least one original codebook to the at least one current code vector. Then the at least one codebook is reordered. Finally the selected at least one preliminary codebook index of the at least one original codebook is mapped to at least one codebook index of the at least one reordered codebook.

To have as much information available as possible from both previous and current compression rounds, the reordering can be delayed in general to the last possible moment. At an encoding side, each reordering may be performed for instance just before a lossless compression of the codebook index and the subsequent transmission or storage. The transmitted or stored codebook index then follows the indexing strategy obtained in this reordering. Similarly, at the decoding side, the reordering can be performed for instance just before accessing the codebook of a particular stage at the decoder.

The at least one codebook can be reordered physically, that is, a new codebook comprising codebook indices and the associated code vectors is generated. In order to reduce the computational load, however, a mapping vector may be employed for representing the new order. Thus, a codebook may be reordered by generating a mapping vector mapping codebook indices of the original codebook to codebook indices of the reordered codebook.

The provided at least one codebook index may be subjected for example to a lossless compression for storage or transmission. The efficiency of the lossless compression is increased significantly by the proposed codebook reordering. Advantageously, the employed lossless compression technique is a simple but efficient technique, such as Huffman coding or arithmetic coding. The lossless compression can be carried out separately for each implemented quantization stage or jointly for two or more stages. It has to be noted, though, that a joint compression is not a practical solution in all cases. A Huffman table or tree employed for a Huffman coding, for example, becomes bigger in a joint compression.

Instead of applying a separate lossless compression to the provided at least one codebook index, it is also possible to integrate the lossless compression step directly in the mapping table of a respective codebook.

The mapping of a current data vector to at least one current code vector can be performed in particular by an advanced quantization structure, like a multistage quantization structure, a predictive quantization structure or a predictive multistage quantization structure, the latter being one of the most advanced quantizer structures.

The reordering criterion may then take into account for example code vectors selected at the current compression pass at one or more quantization stages, code vectors selected at the preceding compression pass at one or more quantization stages, predicted vectors, if any, determined at the current compression pass and at the preceding compression pass, and/or some mean vector, etc.

The reordering can be based for example on a distortion measure, where the code vector resulting in the smallest distortion is arranged at the first place, where the code vector resulting in the second smallest distortion is arranged at the second place, etc. The distortion can be computed for example between a first value and a second value. The first value may comprise the code vector for which the distortion is to be computed and in addition intermediate results from the current compression pass, while the second value may comprise intermediate results from the preceding compression pass.

It has to be noted, though, that a distortion measure based reordering criterion is not the only option. It would also be possible, for example, to use instead a similarity based reordering criterion that operates similarly as the proposed distortion based criterion, but in which the reordering is done in the order of decreasing similarity.

In the case of erroneous channels, it might be necessary to maintain the synchrony between the encoding side and the decoding side. In one embodiment of the invention, therefore synchronization information is provided in addition, which enables a synchronization of a decompression of the provided at least one codebook index with the compression. For such synchronization information, only a fraction of the achieved bit rate savings are required.

The invention can be employed for the compression of a variety of data. The data vectors may comprise for example speech data, audio data, image data, and/or video data. It can also be employed for a wide range of applications that require data compression, for instance in multimedia applications.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

DETAILED DESCRIPTION OF THE INVENTION

Figure 1:
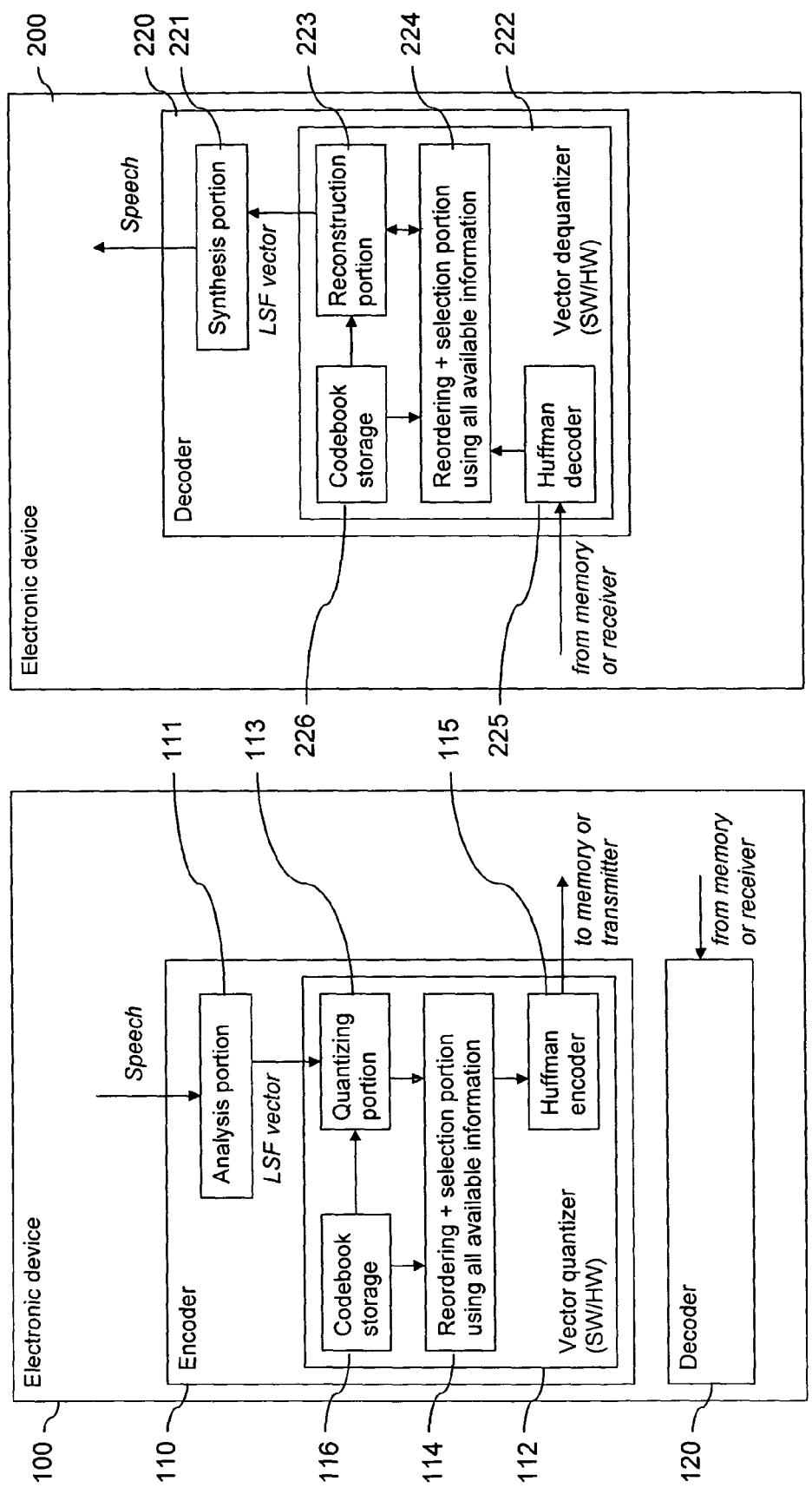
FIG. 1 is a schematic block diagram of a system according to an embodiment of the invention.

FIG. 1 is a schematic block diagram of an exemplary system, which employs an efficient vector quantization in accordance with the invention.

The system comprises a first electronic device 100 and a second electronic device 200, between which encoded speech data is to be exchanged. The electronic devices 100, 200, could be for instance mobile phones.

The first electronic device 100 comprises an encoder 110. The input of the encoder 110 may be connected for example to a microphone of the electronic device 100 (not shown). The output of the encoder 110 is connected to a transmitter of the electronic device 100 (not shown). Alternatively or in addition, it could be connected for instance to a memory of the electronic device 100 or to a memory that may be connected to the electronic device 100. Within the encoder 110, the input of the encoder 110 is connected via an analysis portion 111 and a vector quantizer 112 to the output of the encoder 110. The vector quantizer 112 comprises a quantizing portion 113 that is connected via a reordering and selection portion 114 to a lossless compression encoder 115. The lossless compression encoder 115 is indicated by way of example to be a Huffman encoder. The quantizing portion 113 and the reordering and selection portion 114 both have access to a codebook storage 116. The quantizing portion 113 may be for example a conventional advanced quantizing portion, like a multi-stage quantizing portion, a predictive quantizing portion or a combination of both. The reordering and selection portion 114 is enhanced in accordance with the invention. The functions of the quantizing portion 113, of the reordering and selection portion 114 and of the Huffman encoder 115 can be realized in hardware and/or in software that may be executed by a general or a dedicated processing unit of the electronic device 100.

The first electronic device 100 may comprise in addition a decoder 120. An input of the decoder 120 is connected to a receiver of the electronic device 100 (not shown) or to a memory. An output of the decoder 120 may be connected for instance to a loudspeaker of the electronic device 100 (not shown).

The second electronic device 200 comprises a decoder 220. An input of the decoder 220 is connected to a receiver of the electronic device 200 (not shown). Alternatively or in addition, it could be connected to a memory of the electronic device 200 or to a memory that may be connected to the electronic device 200. An output of the decoder 220 may be connected for instance to a loudspeaker of the electronic device 200 (not shown). Within the decoder 220, the input of the decoder 220 is connected via a vector dequantizer 222 and a synthesis portion 221 to the output of the decoder 220. The vector dequantizer 222 comprises a lossless compression decoder 225, like a Huffman decoder, which is connected via a reordering and selection portion 224 to a reconstruction portion 223. The reordering and selection portion 224 and the reconstruction portion 223 both have access to a codebook storage 226. The reconstruction portion 223 is implemented in a complementary way as the quantizing portion 113 of the encoder 110 of the first electronic device 100. The reordering and selection portion 224 is implemented in accordance with the invention. The functions of the reconstruction portion 223, of the reordering and selection portion 224 and of the Huffman decoder 225 can be realized in hardware and/or in software that may be executed by a general or a dedicated processing unit of the electronic device 200.

The second electronic device 200 may comprise in addition an encoder (not shown) that is arranged in the second electronic device 200 in the same manner as the encoder 110 is arranged in the first electronic device 100.

The decoder 120 of the first electronic device 100 may be implemented in the same manner as the decoder 220 of the second electronic device 200.

Figure 2:
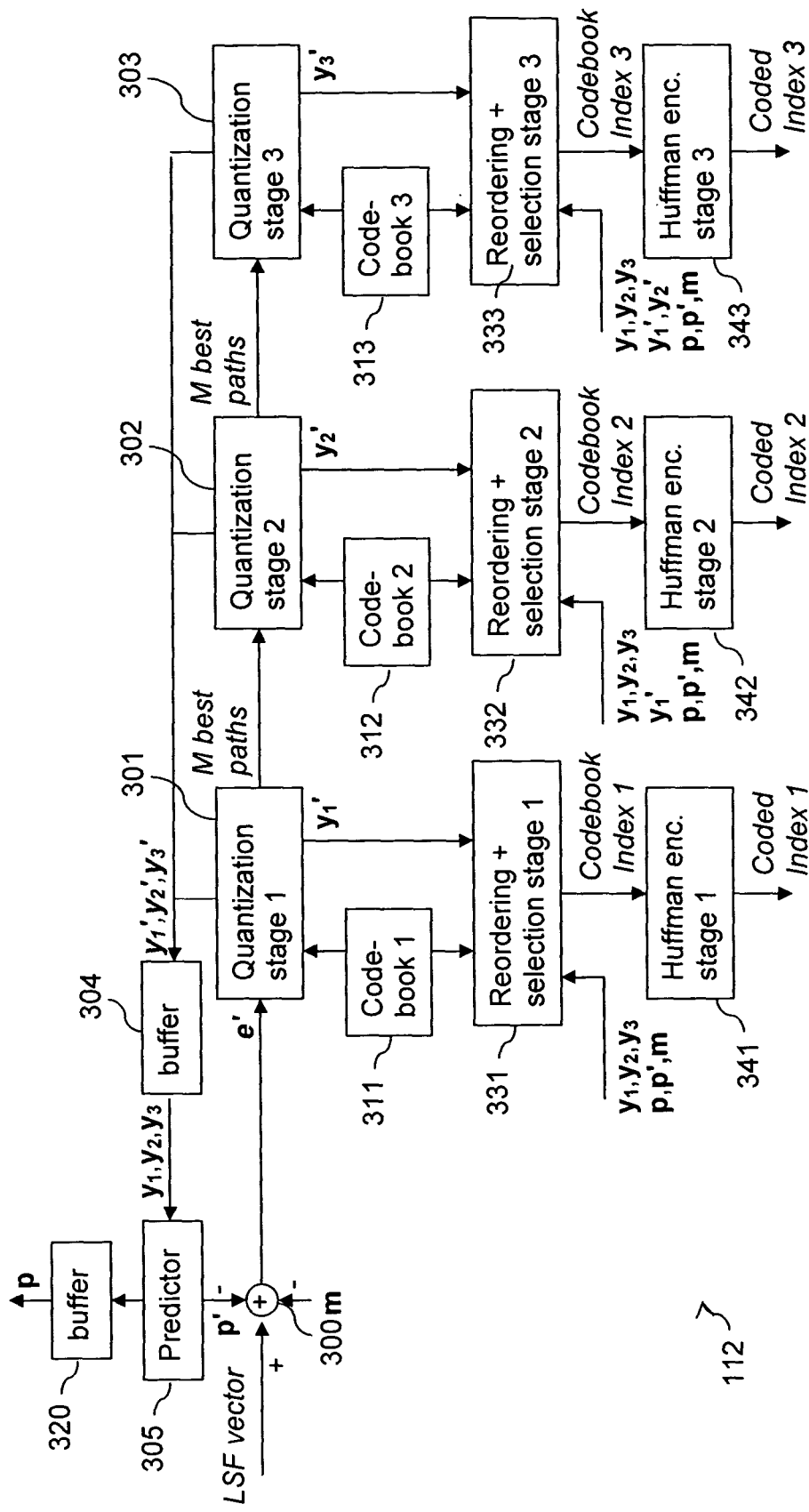
FIG. 2 is a schematic block diagram of a vector quantizer according to an embodiment of the invention.

FIG. 2 is a schematic block diagram illustrating in more detail the principle structure of the vector quantizer 112 of the encoder 110 of FIG. 1. In particular, it indicates the information that is provided to the reordering and selection portion 114 for realizing a codebook reordering. For a more convenient presentation of the structure, the quantization portion 113 is indicated to be realized as a predictive three-stage quantization portion. It is to be understood that any other number of quantization stages could be employed just the same. Furthermore, the quantization portion 113 could also be realized in various other ways, for instance without the prediction or with a single quantization stage.

A line spectral frequency (LSF) vector input is connected via a summing unit 300, a first quantization stage 301 and a second quantization stage 302 to a third quantization stage 303. The three quantization stages 301, 302, 303 can be realized for instance as conventional sequential quantization stages or as conventional M-L tree quantization stages. Each quantization stage 301, 302, 303 has access to an own codebook 311, 312, 313 for selecting a respective code vector $y_1'$, $y_2'$, $y_3'$. Each selected code vector $y_1'$, $y_2'$, $y_3'$ is provided on the one hand as a current code vector for further processing in the same compression pass, and on the other hand for the next compression pass via a buffer 304 as a then preceding code vector $y_1$, $y_2$, $y_3$.

The buffer 304 is connected to a predictor 305 predicting the current mean-removed LSF vector p' based on at least one set of preceding code vectors $y_1$, $y_2$, $y_3$. The prediction can be implemented for instance in form of an auto-regressive prediction, of a moving average prediction or of a combination of these, to mention some options. The predicted current mean-removed LSF vector p' is provided on the one hand to the summing unit 300, in order to enable the summing unit 300, which receives in addition a mean vector m, to determine the error vector e' between the current mean-removed input LSF vector and the predicted current mean-removed LSF vector p'. The predicted current mean-removed LSF vector p' is moreover provided to a further buffer 320 outputting a respective predicted preceding mean-removed LSF vector p. The employed mean vector m is usually a constant vector that is computed during a training procedure. It is to be understood, though, that it is also possible to make the mean vector m non-constant. In this case, the vector could be transmitted or stored for instance as relatively infrequent update information.

The summing unit 300, the quantization stages 301, 302, 303, the buffer 304 and the predictor 305 of FIG. 2 belong to the quantizing portion 113 of FIG. 1. The codebooks 311, 312, 313 of FIG. 2 are stored in the codebook storing portion 116 of FIG. 1.

To each quantization stage 301, 302, 303, an own reordering and selection stage 331, 332, 333, is associated. Each reordering and selection stage 331, 332, 333 has access to the same codebook 311, 312, 313 as the associated quantization stage 301, 302, 303.

The first reordering and selection stage 331 receives from the first quantization stage 301 the current code vector $y_1'$, for which a first codebook index is to be determined. In addition, it receives the preceding code vectors $y_1$, $y_2$, $y_3$ from all quantization stages 301, 302, 303 via buffer 304, the predicted current mean-removed LSF vector p' from predictor 305, and the preceding predicted mean-removed LSF vector p via buffer 320, and the pre-computed mean vector m.

The second reordering and selection stage 332 receives from the second quantization stage 302 the current code vector $y_2'$, for which a second codebook index is to be determined. In addition, it receives the preceding code vectors $y_1$, $y_2$, $y_3$ from all quantization stages 301, 302, 303 via buffer 304, the current code vector $y_1'$ from the first quantization stage 301, the predicted current mean-removed LSF vector p' from predictor 305, the preceding predicted mean-removed LSF vector p via buffer 320, and the pre-computed mean vector m.

The third reordering and selection stage 333 receives from the third quantization stage 303 the current code vector $y_3'$, for which a third codebook index is to be determined. In addition, it receives the preceding code vectors $y_1$, $y_2$, $y_3$ from all quantization stages 301, 302, 303 via buffer 304, the current code vectors $y_1'$, $y_2'$ from the first quantization stage 301 and the second quantization stage 302, the current predicted mean-removed LSF vector p' from predictor 305, the preceding predicted mean-removed LSF vector p via buffer 320, and the pre-computed mean vector m.

The reordering and selection stages 331, 332, 333, and the buffer 320 of FIG. 2 belong to the reordering and selection portion 114 of FIG. 1.

To each reordering and selection stage 331, 332, 333, an own Huffman encoding stage 341, 342, 343 is associated. The Huffman encoding stages 341, 342, 343 of FIG. 2 belong to the Huffman encoder 115 of FIG. 1.

Figure 3:
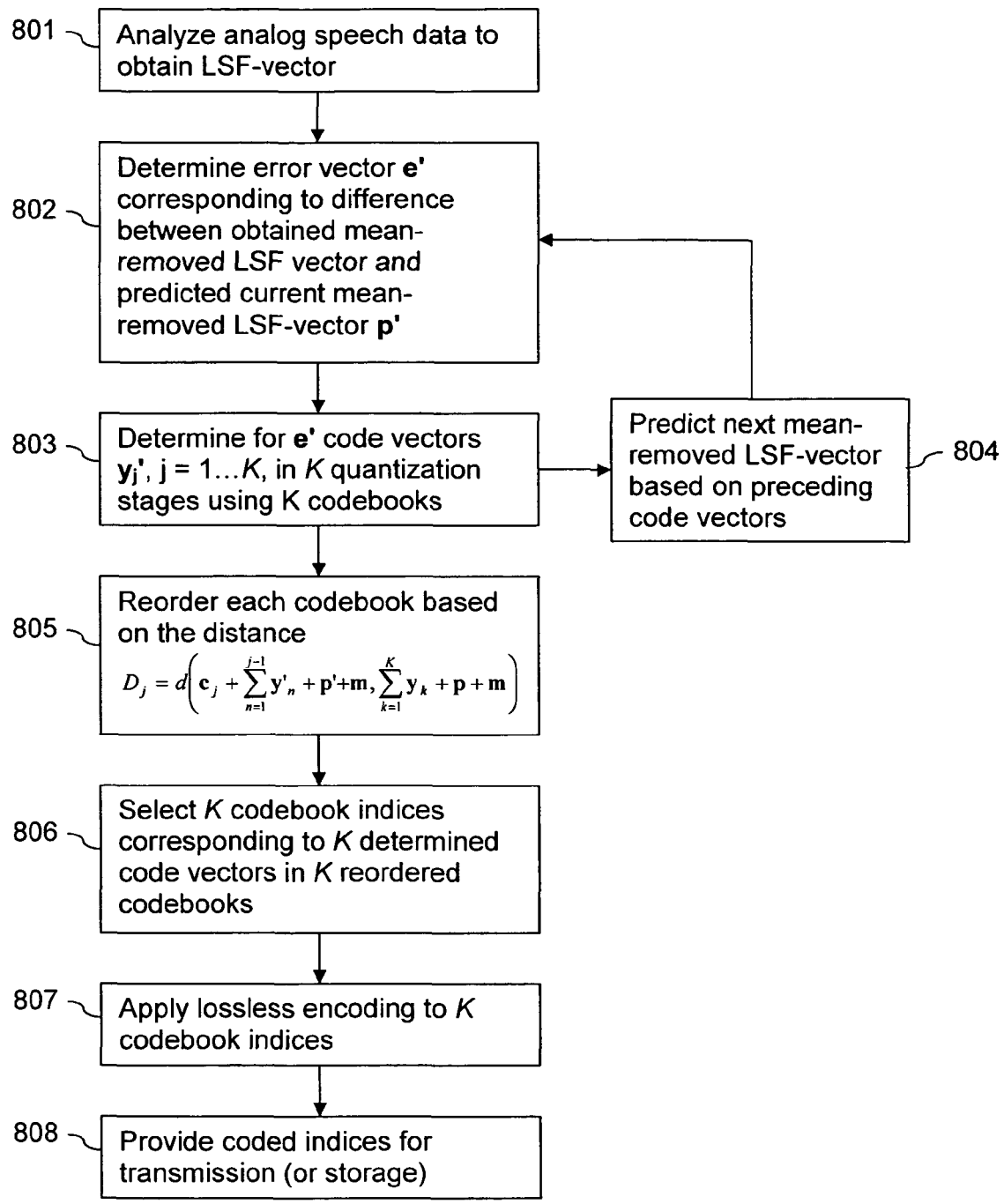
FIG. 3 is a flow chart illustrating an encoding operation in the system of FIG. 1.

FIG. 3 illustrates the operation at the encoder 110 of FIG. 1 for the situation that speech data is to be transmitted from electronic device 110 to electronic device 220.

The speech data is captured by the electronic device 100 for instance by means of a microphone and provided to the analysis portion 111.

The analysis portion 111 analyzes the speech data and generates LSF vectors from this speech data in a conventional manner (step 801). The resulting LSF vectors are provided sequentially to the quantization portion 113 of the vector quantizer 112 for entering a respective compression pass. It has to be noted that the LSF vectors alone do not provide enough information for describing speech. Thus, the analysis block also produces in a conventional manner some other pieces of information in addition to the LSF vectors that are not dealt with in this document.

In the quantization portion 113, the summing unit 300 determines the difference between the current mean-removed input LSF vector and a predicted current mean-removed LSF vector p' that is provided by the predictor 305 (step 802). The difference is provided as an error vector e' to the first quantization stage 301.

Proceeding from this error vector e', each of the K=3 quantization stages 301, 302, 303 now selects a code vector $y_1'$, $y_2'$, $y_3'$ from the associated codebook 311, 312, 313 in a conventional manner, for instance such that the sum of the selected code vectors $y_1'$, $y_2'$, $y_3'$ represents the best achievable approximation of the error vector e' (step 803).

The code vectors $y_1'$, $y_2'$, $y_3'$ are also used by the predictor 305 for predicting the mean-removed LSF vector that is to be provided to the summing unit 300 in the next compression pass (step 804). The general use of mean-removed vectors is not required, but simplifies the operations.

In the present compression pass, for each of the current code vectors $y_1'$, $y_2'$, $y_3'$, a codebook index has to be determined by a respective reordering and selection stage 331, 332, 333.

To this end, each codebook 311, 312, 313 is first reordered by the associated reordering and selection stage 331, 332, 333, (step 805). As in the known dynamic codebook reordering approaches, the reordering is based on a distortion measure. That is, for each code vector in the codebook, a distortion measure is determined, and the code vectors are then sorted in the order of an increasing distortion measure, implying that new codebook indices are associated to the code vectors. However, compared to the conventional distortion measure, more information is considered in the calculations.

For computing the distance $D_j$, more specifically the following equation is used by each reordering and selection stage 331, 332, 333:

$$D_j = d\left(c_j + \sum_{n=1}^{j-1} y_n' + p' + m, \sum_{k=1}^{K} y_k + p + m\right), \quad (4)$$

where K is the total number of stages, and where j is the stage number of the concerned reordering and selection stage 331, 332, 333, and thus an integer between 1 and K. Further, $y_k$ denotes the code vector selected at stage k during the previous compression pass, $y'_n$ denotes the code vector selected at the earlier stage n during the current compression pass, p is the predicted mean-removed LSF vector from the previous compression pass, p' denotes the predicted current mean-removed LSF vector from the current compression pass, and m is a mean vector. Finally, $c_j$ is the respective code vector from stage j for which the distance is to be computed, and $d(\cdot)$ is a distortion measure, like the Eucledian distance.

In the calculation of the distortion, mean vector m is included to make the equation more complete. It would also be possible to omit m. With some distortion measures, this would not even affect the result; for instance when the Euclidean distance is used as distortion measure, $d(x,y)=d(x-m,y-m)$.

It has to be noted that equation (4) is applicable to multi-stage vector quantization, to predictive vector quantization, and to a combination of both, as in the example of FIG. 2. If there is only a single stage, K can be set to 1. If the quantizer structure of the quantizing portion 113 does not include prediction, both p and p' can be set to zero vectors.

It should further be noted that equation (4) does not offer the only solution. In another embodiment of the invention, it would be possible, for instance, to add scalar or matrix multiplier(s) to the equation. Moreover, it is also possible to explicitly use information from one or more additional passes, for example by using a higher predictor order and longer buffers to support the predictor(s). Furthermore, the prediction can be done in two or more steps, e.g. p=p1+p2. Moreover, another criterion than a distortion measure could be selected for the reordering in the first place. Obviously, there is a large number of further possible variations.

It is to be understood that the reordering and selection stages 331, 332, 333, do not have to reorder the codebooks 311, 312, 313 "physically" in the storage space 116. Instead, they may use a mapping vector that represents the new order. For example, the first entry of such a mapping vector may contain the original index of the code vector that should be in the first place, and so on.

Each reordering and selection stage 331, 332, 333, then selects the codebook index of the associate reordered codebook which belongs to the received current code vector $y_1'$, $y_2'$, $y_3'$ (step 806).

It is to be understood that steps 805 and 806 could also be applied in a reversed order. That is, first each reordering and selection stage 331, 332, 333, selects the codebook index of the associate original codebook 311, 312, 313 which belongs to the received current code vector $y_1'$, $y_2'$, $y_3'$. Then, each reordering and selection stage 331, 332, 333, performs the described codebook reordering. And finally, the selected codebook index is mapped to the corresponding codebook index in the reordered codebook.

In either case, the resulting final codebook index is provided by each reordering and selection stage 331, 332, 333 to the associated Huffman encoding stage 341, 342, 343. The Huffman encoding stages 341, 342, 343 apply a lossless compression to the received codebook indices (step 807).

Now, the encoded indices may be provided as binary information for transmission to electronic device 200 (step 808). Alternatively, they could be provided for storage in a memory.

It has to be noted that in step 803, it is possible to reduce the search space by basing the search on the last codebook order achieved in step 805 of the preceding compression pass, as it is very unlikely that the last vectors in the reordered codebook would be selected. Alternatively or in addition, the search could be accelerated by using a simplified distortion measure to quickly rule out impossible selections.

Figure 4:
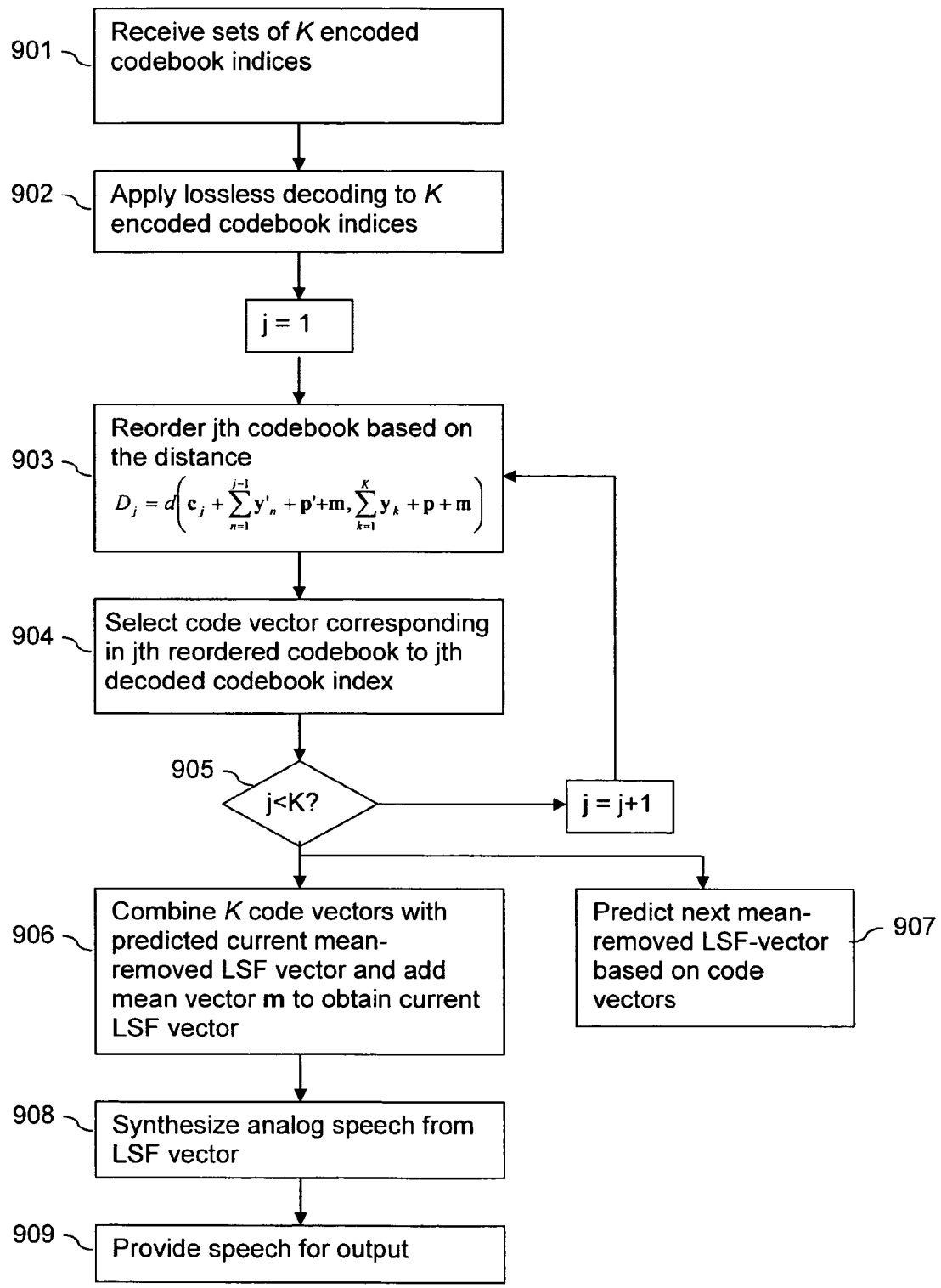
FIG. 4 is a flow chart illustrating a decoding operation in the system of FIG. 1.

FIG. 4 illustrates the operation at the decoder 220 of FIG. 1 for the situation that encoded codebook indices received via a receiver of the electronic device 200 are to be decoded for presentation to a user.

When encoded codebook indices are received by the electronic device 200 (step 901), they are forwarded to the Huffman decoder 225. The codebook indices are processed in sets of K=3 in a respective decompression pass.

The Huffman decoder 225 performs a lossless codebook index decoding on each codebook index of a set of three codebook indices (step 902). The resulting decoded codebook indices are provided to the reordering and selection portion 224.

The reordering and selection portion 224 now reorders a first codebook stored in the codebook storage 226 based on equation (4). All required information is available from preceding decompression passes (step 903).

The reordering and selection portion 224 then selects a first code vector $y_1'$ that is associated in the reordered first codebook to the received and decoded first codebook index (step 904).

Once the first code vector $y_1'$ is known, the reordering and selection portion 224 reorders a second codebook stored in the codebook storage 226 based on equation (4), using information that is available from preceding decompression passes and in addition using the value of the determined first code vector $y_1'$ (step 903). The reordering and selection portion 224 then selects a second code vector $y_2'$ that is associated in the reordered second codebook to the received and decoded second codebook index (step 904).

Once the second code vector $y_2'$ is known, the reordering and selection portion 224 reorders a third codebook stored in the codebook storage 226 based on equation (4), using information that is available from preceding decompression passes and in addition using the value of the current first and second code vector (step 903). The reordering and selection portion 224 then selects a third code vector $y_3'$ that is associated in the reordered third codebook to the received and decoded third codebook index (step 904).

When all code vectors $y_1'$, $y_2'$, $y_3'$ for a set of received codebook indices have been selected (step 905), the reconstruction portion 223 performs a conventional three-stage dequatization with prediction (step 906). That is, the three code vectors $y_1'$, $y_2'$, $y_3'$ are combined to a single error vector e', which is then combined with a prediction p' of the current mean-removed LSF vector, to regain the actual dequantized mean-removed LSF vector. The predicted current mean-removed LSF vector p' has been generated based on code vectors $y_1$, $y_2$, $y_3$ obtained in at least one preceding decompression pass. The final reconstructed LSF vector is then obtained by adding in addition the mean vector m to the mean-removed LSF vector.

The current three code vectors $y_1'$, $y_2'$, $y_3'$ are moreover used by the reconstruction portion 223 for predicting the next mean-removed LSF vector for the next decompression pass (step 907). The current three code vectors and the predicted next mean-removed LSF vector are also provided to the reordering and selection portion 224 for the next decompression pass.

The reconstructed dequantized LSF vector is provided to the synthesis portion 221 for generating an analog speech signal (step 908), which is then output for instance via a loudspeaker of the electronic device 200 (step 909). It has to be noted again that the LSF vectors alone do not provide enough information for describing speech. Thus, the synthesis portion 221 receives additional inputs for synthesizing speech in a conventional manner that are not dealt with in this document.

It is to be understood that the same process could be performed for instance by the decoder 120 of the first electronic device 100 based on encoded codebook indices retrieved from a memory or received from some other electronic device.

The presented dynamic codebook reordering brings the efficiency of the data coding to a new level by taking into account the whole quantizer structure and all the pieces of information that are available within the quantizer structure. To maximize the amount of available information, each reordering is delayed to the last possible moment, in contrast to the conventional dynamic codebook reordering, where the reordering is carried out after each quantization. More specifically, each reordering at the encoder side is performed just before storing or transmitting the corresponding index and after finishing the codebook searches. The transmitted or stored index then follows the indexing strategy obtained in this reordering. Similarly, the reorderings at the decoder side are performed just before accessing each of the stage codebooks and after completing the dequantization for the previous stages.

The presented modifications make favourable changes to the probability distribution, which in turn reduces entropy and significantly improves the compression efficiency.

It should also be noted that the presented reordering can be used at the encoder sequentially for all the stages after the best codebook vectors for all stage have been determined, without losing any of the performance advantage. This makes it possible to perform the search optimally using, for example, tree search algorithms. Consequently, the use of the invention does not cause any negative effects to the compression efficiency in any circumstances. With other encoding structures, for example multistage structures using a sequential search, all processing steps for one stage could also be completed before proceeding to the next stage.

It should further be noted that it is not necessary to perform the lossless compression right after the reordering. For example, the lossless compression could be carried out after a certain block of data vectors has been otherwise fully quantized—or even after processing all the data. In fact, this is the most reasonable approach if the lossless compression is done using arithmetic coding, as in arithmetic coding, the compression is typically done for several symbols at the same time.

To demonstrate the clear performance advantages that the invention offers, some practical experimental results achieved in a speech coding application will be presented in the following.

The invention was tested in the framework of speech coding, and more specifically in the quantization of line spectral frequency (LSF) vectors derived from time-varying linear prediction (LP) coefficients. Since many speech coders utilize linear prediction, this quantization task is one of the most common tasks in speech coding.

The invention was compared in the experiments to three prior-art quantizer structures. A first considered conventional quantizer structure A used an advanced quantization without any subsequent lossless compression. A second considered conventional quantizer structure B used an advanced quantization with subsequent lossless compression, but without codebook reordering. A third considered conventional quantizer structure C used an advanced quantization, a conventional codebook reordering and a subsequent lossless compression. The structure according to the invention used an advanced quantization, an enhanced codebook reordering and a subsequent lossless compression.

The experiments were performed moreover for two types of advanced quantizer structures, namely a multistage quantizer and a predictive multistage quantizer. Both quantizer structures included four stages with 64, 64, 32 and 32 code vectors in their codebooks, corresponding to 6+6+5+5 bits per vector in prior art case A. The prediction was made using first order auto-regressive prediction with a diagonal predictor matrix. The quantizers were trained using the multistage vector quantization simultaneous joint design algorithm described for example in the above cited document "Pitch-cycle waveform quantization in a 4.0 kbps WI speech coder". In the predictive case, the predictor and the codebooks were jointly optimized using the asymptotic closed loop approach. The training set contained 180,000 LSF vectors and the test set included 180,118 LSF vectors, scaled to the interval between 0 and $\pi$, both estimated at 10 ms intervals from 8 kHz speech signals, including speech from many female and male speakers and several languages. The weighted squared error distortion measure was used both in searching (tree search) and in reordering. The weights were computed similarly as described by U. Sinervo, J. Nurminen, A. Heikkinen and J. Saarinen in: "Evaluation of split and multistage techniques in LSF quantization", proceedings of Norsig 2001, pp. 18-22.

The first experiments were performed using a multistage quantizer structure.

As concluded already in the above cited document "Using dynamic codebook re-ordering to exploit inter-frame correlation in MELP coders", the improvement achieved by a conventional dynamic codebook reordering in the last stages of a multistage quantizer structure is very small. The experiments showed that the use of the present invention significantly improves the coding efficiency, also in the last stages. More specifically, the invention outperformed the other approaches A, B and C with a very clear margin and offered savings between 320 bits/second—compared to the best prior art approach C—and 651 bits/second—compared to prior art approach A. In terms of percents, the savings were between 17% and 30%. The bitrate improvements were achieved without any loss of accuracy, as the quantization results are identical due to the identical codebooks. It should also be noted that these results are just exemplary and the performance of the invention can be even higher in some other cases. For instance, when used in a six-stage structure, the invention outperformed the best prior art approach C by 19%.

The enhanced performance results from the fact that the invention improves the reordering. From the compression point of view, the flatter the distribution of index probabilities is, the smaller the achievable compression becomes. Compared to cases B and C, the invention resulted in the best distribution already in the first stage, though prior art C was quite close. In the latter stages, the enhancement achieved using the invention became increasingly larger. In general, the distribution achieved using the invention was clearly superior, that is, less flat, when compared to both prior art approaches using a lossless compression.

The next experiments were performed using a predictive multistage quantizer structure.

The predictive multistage quantizer structure is one of the most advanced quantizer structures. However, the experiments showed that the present invention is still able to enhance the coding efficiency and to outperform the conventional approaches. In terms of bits, the improvement was between 72 bits/second—compared to prior art C—and 190 bits/second—compared to prior art A. Though the improvements were smaller than in the case without prediction, they were still meaningful and they could be achieved without any loss of accuracy.

Finally, the invention was also evaluated in a quick small-scale test against the prior art approach resented in the above cited document "DCRVQ: A new strategy for efficient entropy coding of vector-quantized images". The method presented in this document cannot be used with multistage structures, so the performance was only evaluated with one stage. To make the evaluation fair and to be able to use the same codebooks, the distortion measure used with the method presented in the document was upgraded to the weighted squared error, identical to the one used for the implementation of the invention. In a first test, the prior art method used prediction while the implementation of the invention did not use prediction. The resulting quantization accuracies were identical in both cases, but the invention still offered a lower bitrate. In a second test, both methods used prediction. In this case, the prior art approach needed slightly less bits, the difference being less than 5%, but the invention offered superior accuracy: the average weighted squared error achieved with the prior art method was over 116% higher than the error achieved with the method according to the invention. Thus, from the viewpoint of compression efficiency, the invention very clearly outperformed this prior art approach as well.

It is thus an advantage of the invention that it constantly outperforms the conventional approaches. It provides an enhanced compression ratio and enables bitrate savings without any loss of accuracy and/or an increased accuracy. Further, it shows a high flexibility, as it does not limit the quantizer structures or search strategies that can be employed. Thus, the invention makes it possible in particular to achieve both a high accuracy by using an advanced quantizer structures and bitrate savings by using an enhanced dynamic codebook reordering at the same time. It can also be used with existing codebooks. Further, there is no need to transmit or store any side information, and for the implementation, only very little or no additional complexity is required.

The additional complexity compared to case C caused by the use of the invention, for instance, can be made negligible by careful design and using simple precalculations in the computation of Equation (4). For example, it would be possible to precalculate, store and utilize intermediate results during the operation. The portion after the comma in the distortion measure d(,) can be stored as such from the previous pass. The portion before the comma can be first calculated for the first stage. Then for the next stages, it is sufficient to only add the new information, namely the result from the previous stage of the current pass, in the sum. In this way, the additional complexity is only a single add operation per stage.

The invention can also be applied to many applications that require data compression in some form, for instance in the scope of speech coding, audio coding, image coding, video coding, etc. One example is the use in a parametric speech codec.

While there have been shown and described and pointed out fundamental novel features of the invention as applied to preferred embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for performance by at least one processing unit in compressing data vectors sequentially in a respective compression pass said method comprising:
said at least one processing unit mapping a current data vector to at least one current code vector of at least one codebook in at least one quantization stage;
said at least one processing unit reordering said at least one codebook taking account of at least one intermediate result from a current compression pass and at least one intermediate result from a preceding compression pass, wherein said intermediate result from a preceding compression pass comprises at least one of: (a) a codevector selected for two or more quantization stages of a multistage quantizer during the preceding compression pass and (b) a predicted vector from the preceding compression pass; and
providing at least one codebook index that is associated in said at least one reordered codebook to said at least one current code vector;
wherein said reordering is based at least upon a sum of code vectors respectively selected at earlier stages during the current compression pass.

2. The method according to claim 1, wherein for providing said at least one codebook index, first said at least one codebook is reordered, and then at least one codebook index is selected that is associated in said at least one reordered codebook to said at least one current code vector.

3. The method according to claim 1, wherein for providing said at least one codebook index, first at least one preliminary codebook index is selected that is associated in said at least one codebook to said at least one current code vector, then said at least one codebook is reordered, and finally said selected at least one preliminary codebook index of said at least one codebook is mapped to at least one codebook index of said at least one reordered codebook.

4. The method according to claim 1, wherein said at least one codebook is reordered by generating a mapping vector mapping codebook indices of said codebook to codebook indices of said reordered codebook.

5. The method according to claim 1, further comprising applying a lossless compression to said provided at least one codebook index.

6. The method according to claim 1, wherein said mapping of a current data vector to at least one current code vector is performed by an advanced quantization structure.

7. The method according to claim 6, wherein said advanced quantization structure is one of a multistage quantization structure, a predictive quantization structure and a predictive multistage quantization structure.

8. A method for performance by at least one processing unit in compressing data vectors sequentially in a respective compression pass, said method comprising:
said at least one processing unit mapping a current data vector to at least one current code vector of at least one codebook in at least one quantization stage;
said at least one processing unit reordering said at least one codebook taking account of at least one intermediate result from a current compression pass and at least one intermediate result from a preceding compression pass, wherein said intermediate result from a preceding compression pass comprises at least one of: (a) a codevector selected for two or more quantization stages of a multistage quantizer during the preceding compression pass and (b) a predicted vector from the preceding compression pass; and
providing at least one codebook index that is associated in said at least one reordered codebook to said at least one current code vector, wherein said mapping of a current data vector to at least one current code vector is performed by a multistage quantization structure, and wherein said reordering is based at least upon a sum of code vectors respectively selected at earlier stages during the current compression pass.

9. The method according to claim 1, wherein said mapping of a current data vector to at least one current code vector is performed by a predictive one-stage quantization structure, and wherein said reordering is based on the following distance of each code vector in a codebook:

$$D = d(c + p' + m, y + p + m),$$

where y is the code vector selected during the previous compression pass,
where p is a predicted vector from the previous compression pass, where p' is a predicted vector from the current compression pass, where m is an optional mean vector, where $c_j$ is the respective code vector from stage j for which the distance is to be computed, and where $d(\cdot)$ is a distortion measure.

10. The method according to claim 1, wherein said mapping of a current data vector to at least one current code vector is performed by a predictive multistage quantization structure, and wherein said reordering is based on the following distance of each code vector in a respective codebook:

$$D_j = d\left(c_j + \sum_{n=1}^{j-1} y'_n + p' + m, \sum_{k=1}^{K} y_k + p + m\right),$$

where K is the total number of quantization stages, where j is the stage number, where $y_k$ is the code vector selected at stage k during the previous compression pass, where $y'_n$ is the code vector selected at the earlier stage n during the current compression pass, where p is a predicted vector from the previous compression pass, where p' is a predicted vector from the current compression pass, where m is an optional mean vector, where $c_j$ is the respective code vector from stage j for which the distance is to be computed, and where $d(\cdot)$ is a distortion measure.

11. The method according to claim 1, further comprising providing synchronization information enabling a synchronization of a decompression of said provided at least one codebook index with said compression.

12. The method according to claim 1, wherein said data vectors comprise at least one of speech data, audio data, image data, and video data.

13. An encoder comprising a processing unit and a storage medium including computer program code for compressing data vectors sequentially in a respective compression pass, the storage medium and the computer program code configured to, with the processing unit, cause the encoder at least to:
 map a current data vector to at least one current code vector of at least one codebook in at least one quantization stage;
 reorder at least one codebook taking account of at least one intermediate result from a current compression pass and at least one intermediate result from a preceding compression pass wherein said intermediate result from a preceding compression pass comprises at least one of: (a) a codevector selected for two or more quantization stages of a multi-stage quantizer during the preceding compression pass and (b) a predicted vector from the preceding compression pass; and
 provide at least one codebook index that is associated in at least one reordered codebook to at least one current code vector;
 wherein the encoder is configured to perform said reordering based at least upon a sum of code vectors respectively selected at earlier stages during the current compression pass.

14. The encoder according to claim 13, wherein the storage medium and the computer program code configured to map a current data vector to at least one current code vector of at least one codebook in at least one quantization stage form an advanced quantization structure.

15. The encoder according to claim 14, wherein said advanced quantization structure is one of a multistage quantization structure, a predictive quantization structure and a predictive multistage quantization structure.

16. An electronic device comprising a processing unit and a storage medium including computer program code for a sequential compression of data vectors in a respective compression pass, the storage medium and the computer program code configured to, with the processing unit, cause the encoder at least to:
 map a current data vector to at least one current code vector of at least one codebook in at least one quantization stage;
 reorder at least one codebook taking account of at least one intermediate result from a current compression pass and at least one intermediate result from a preceding compression pass, wherein said intermediate result from a preceding compression pass comprises at least one of: (a) a codevector selected for two or more quantization stages of a multi-stage quantizer during the preceding compression pass and (b) a predicted vector from the preceding compression pass; and
 provide at least one codebook index that is associated in at least one reordered codebook to at least one current code vector;
 wherein the reordering is based at least upon a sum of code vectors respectively selected at earlier stages during the current compression pass.

17. A non-transitory software program product in which a software code for compressing data vectors sequentially in a respective compression pass is stored, said software code realizing the following steps when being executed by a processing unit of an electronic device:
 mapping a current data vector to at least one current code vector of at least one codebook in at least one quantization stage;
 reordering said at least one codebook taking account of at least one intermediate result from a current compression pass and at least one intermediate result from a preceding compression pass, wherein said intermediate result from a preceding compression pass comprises at least one of: (a) a codevector selected for two or more quantization stages of a multistage quantizer during the preceding compression pass and (b) a predicted vector from the preceding compression pass; and
 providing at least one codebook index that is associated in said at least one reordered codebook to said at least one current code vector;
 wherein the reordering is based at least upon a sum of code vectors respectively selected at earlier stages during the current compression pass.

18. The software program product according to claim 17, wherein for providing said at least one codebook index, first said at least one codebook is reordered, and then at least one codebook index is selected that is associated in said at least one reordered codebook to said at least one current code vector.

19. The software program product according to claim 17, wherein said at least one codebook is reordered by generating a mapping vector mapping codebook indices of said codebook to codebook indices of said reordered codebook.

20. A non-transitory software program product in which a software code for compressing data vectors sequentially in a respective compression pass is stored, said software code realizing the following steps when being executed by a processing unit of an electronic device:
 mapping a current data vector to at least one current code vector of at least one codebook in at least one quantization stage;
 reordering said at least one codebook taking account of at least one intermediate result from a current compression pass and at least one intermediate result from a preceding compression pass, wherein said intermediate result from a preceding compression pass comprises at least one of: (a) a codevector selected for two or more quantization stages of a multistage quantizer during the preceding compression pass and (b) a predicted vector from the preceding compression pass; and
 providing at least one codebook index that is associated in said at least one reordered codebook to said at least one current code vector, wherein said mapping of a current data vector to at least one current code vector is performed by a predictive multistage quantization, and wherein said reordering is based at least upon a sum of code vectors respectively selected at earlier stages during the current compression pass.

21. A method for performance by at least one processing unit in a decoder of an electronic device in decompressing compressed data vectors sequentially in a respective decompression pass, wherein each compressed data vector is represented by at least one codebook index, said method comprising:
 said at least one processing unit reordering at least one codebook taking account of at least one intermediate result from a current decompression pass and at least one intermediate result from a preceding decompression pass, wherein said intermediate result from a preceding decompression pass comprises at least one of: (a) a codevector selected for two or more quantization stages of a multi-stage quantizer during the preceding decompression pass and (b) a predicted vector from the preceding decompression pass; and said at least one processing unit mapping at least one codebook index representing a compressed current data vector to at least one code vector of said at least one reordered codebook, and wherein said reordering is based at least upon a sum of code vectors respectively selected at earlier stages during the current compression pass.

22. A decoder comprising a processing unit and a storage medium including program code for decompressing compressed data vectors sequentially in a respective decompression pass, wherein each compressed data vector is represented by at least one codebook index, the storage medium and the computer program code configured to, with the processing unit, cause the decoder at least to:

reorder at least one codebook taking account of at least one intermediate result from a current decompression pass and at least one intermediate result from a preceding decompression pass, wherein said intermediate result from a preceding decompression pass comprises at least one of: (a) a codevector selected for two or more quantization stages of a multi-stage quantizer during the preceding decompression pass and (b) a predicted vector from the preceding decompression pass; and map at least one codebook index representing a compressed current data vector to at least one code vector of said at least one reordered codebook, and wherein said reordering is based at least upon a sum of code vectors respectively selected at earlier stages during the current compression pass.

23. A non-transitory software program product in which a software code for decompressing compressed data vectors sequentially in a respective decompression pass, wherein each compressed data vector is represented by at least one codebook index, is stored, said software code realizing the following steps when being executed by a processing unit of an electronic device:

reordering at least one codebook taking account of at least one intermediate result from a current decompression pass and at least one intermediate result from a preceding decompression pass, wherein said intermediate result from a preceding decompression pass comprises at least one of: (a) a codevector selected for two or more quantization stages of a multi-stage quantizer during the preceding decompression pass and (b) a predicted vector from the preceding decompression pass; and mapping at least one codebook index representing a compressed current data vector to at least one code vector of said at least one reordered codebook, and wherein said reordering is based at least upon a sum of code vectors respectively selected at earlier stages during the current compression pass.

24. A non-transitory storage medium comprising program code stored thereon for carrying out the method of claim 1 when run on a processing unit.

25. The method of claim 8, wherein said reordering is based at least upon the following distance of each code vector in a respective codebook:

$$D_j = d\left(c_j + \sum_{n=1}^{j-1} y'_n + m, \sum_{k=1}^{K} y_k + m\right),$$

where K is the total number of quantization stages, where j is the stage number, where $y_k$ is the code vector selected at stage k during the previous compression pass, where $y'_n$ is the code vector selected at the earlier stage n during the current compression sass where m is an optional mean vector where $c_j$ is the respective code vector from stage i for which the distance is to be computed, and where $d(\cdot)$ is a distortion measure.

26. The software program product of claim 20, wherein said reordering is based at least upon the following distance of each code vector in a respective codebook:

$$D_j = d\left(c_j + \sum_{n=1}^{j-1} y'_n + m, \sum_{k=1}^{K} y_k + m\right),$$

where K is the total number of quantization stages, where j is the stage number, where $y_k$ is the code vector selected at stage k during the previous compression pass, where $y'_n$ is the code vector selected at the earlier stage n during the current compression pass, where m is an optional mean vector, where $c_j$ is the respective code vector from stage j for which the distance is to be computed, and where $d(\cdot)$ is a distortion measure.

\* \* \* \* \*

UNITED STATES PATENT AND TRADEMARK OFFICE
CERTIFICATE OF CORRECTION

PATENT NO. : 8,510,105 B2
APPLICATION NO. : 11/256667
DATED : August 13, 2013
INVENTOR(S) : Nurminen Page 1 of 1

It is certified that error appears in the above-identified patent and that said Letters Patent is hereby corrected as shown below:

In the Claims:

Column 20, Claim 25,
Line 24, "compression sass" should read --compression pass--;
Line 25, "vector where" should read --vector, where--;
Line 26, "stage i" should read --stage j--.

Signed and Sealed this
Twenty-sixth Day of November, 2013

Margaret A. Focarino
*Commissioner for Patents of the United States Patent and Trademark Office*